United States Patent
Matsuyama et al.

(10) Patent No.: US 6,533,864 B1
(45) Date of Patent: Mar. 18, 2003

(54) SOLUTION PROCESSING APPARATUS AND METHOD

(75) Inventors: Yuji Matsuyama, Kikuchi-gun (JP); Shuichi Nagamine, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 259 days.

(21) Appl. No.: 09/639,172

(22) Filed: Aug. 16, 2000

(30) Foreign Application Priority Data

Aug. 17, 1999 (JP) ............................................. 11-230733

(51) Int. Cl.$^7$ ................................................ B05C 11/10
(52) U.S. Cl. ............................ 118/704; 118/52; 118/56; 118/501; 118/500; 118/504; 118/706
(58) Field of Search .................................. 118/500, 501, 118/504, 505, 704, 706, 695, 52, 56, 320, 321, 323, 326; 134/902

(56) References Cited

U.S. PATENT DOCUMENTS

| | | | |
|---|---|---|---|
| 5,252,137 A | | 10/1993 | Tateyama et al. ............... 134/34 |
| 5,374,312 A | | 12/1994 | Hasebe et al. ................. 118/52 |
| 5,762,709 A | * | 6/1998 | Sugimoto et al. ............. 118/319 |
| 5,871,584 A | * | 2/1999 | Tateyama et al. ............. 118/319 |
| 6,076,979 A | * | 6/2000 | Mimasaka et al. ............. 118/52 |

FOREIGN PATENT DOCUMENTS

JP 406120132 A * 4/1994 ................. 118/320

* cited by examiner

Primary Examiner—Richard Crispino
Assistant Examiner—George R. Koch, III
(74) Attorney, Agent, or Firm—Rader, Fishman & Grauer PLLC

(57) ABSTRACT

An upper side of a cup provided around a wafer is formed in a rectangular shape and a lower side thereof is formed in a cylindrical shape. The cup is formed such that, when seen from above, the portion forming the cylindrical shape is positioned within the portion forming the rectangular shape. The cup has a raising and lowering mechanism and is controlled by a control section. The upper side of the cup is placed by the side of the wafer during a scan by a supply nozzle. The lower side of the cup is placed over an upper level and a lower level of the wafer while a rinse liquid and a developing solution are shaken off. The scan by the supply nozzle is performed with the supply nozzle positioned in the upper cup portion.

12 Claims, 10 Drawing Sheets

PRIOR ART

SOLUTION PROCESSING APPARATUS AND METHOD

The present invention relates to a solution processing apparatus and method for performing solution processing such as developing processing and the like for a substrate such as a semiconductor wafer or the like.

A mask for forming a circuit pattern on a front face of a semiconductor wafer (hereinafter, referred to as a wafer) or an LCD substrate of a liquid crystal display is formed by the following process. Initially, coating of a photoresist solution (hereinafter, referred to as a resist) is performed for a front face of a wafer and irradiation with light or the like is performed. If the resist is a negative type by way of example, a portion thereof irradiated with light is cured, and a portion not cured, which is an easy-to-dissolve portion, is dissolved with a developing solution, whereby an object mask is formed. A developing processing apparatus comprises a spin chuck for suction-holding and rotating a semiconductor wafer and a developing solution supply nozzle for supplying a developing solution to the semiconductor wafer on the spin chuck.

Conventionally, a supply nozzle 12 in which many discharge holes 11 are arranged over a length corresponding to a wafer W in a diameter direction shown in FIG. 9B is used as the developing solution supply nozzle used in a developing process as described above.

The discharge of the developing solution by the supply nozzle 12 will be explained with FIG. 9A. The supply nozzle 12 is positioned so that the discharge holes 11 are, for example, 1 mm above a front face of the wafer W at the middle portion of the wafer W, and the wafer W is rotated 180 degrees while the developing solution is supplied from the discharge holes 11 to a middle portion in the diameter direction of the front face of the wafer W. Thereby, the developing solution is spread all over the wafer W while being discharged from the middle portion over the diameter direction of the wafer W, thereby completing solution heaping. Simultaneously, a solution film of the developing solution with a predetermined thickness is formed on the entire front face of the wafer W.

Incidentally, a conventional process of heaping of the developing solution all over a top face of the semiconductor wafer is in need of causing a total stay time of the heaped developing solution to be uniform as much as possible to obtain uniformity of line width. To this end, the developing solution needs to be rapidly applied to the semiconductor wafer, and thus a supply pressure of the developing solution is kept high.

However, in the conventional developing processing method, the developing solution supply nozzle is arranged such that the discharge holes thereof are small in diameter and the supply pressure thereof is set high for the sake of uniform discharge, resulting in high discharge flow velocity. Therefore, an impact on a dissolved portion of the front face of the semiconductor wafer is high at the time of initial discharge to the front face of the semiconductor wafer, whereby the uniformity in line width is susceptible to decreasing.

Further, there exists a portion where the first discharged developing solution and the last discharged developing solution are overlapped within an area close to the middle of the semiconductor wafer under the supply nozzle, whereby old and new developing solutions are mixed and thus developing proceeds in the portion more than in other portions, thereby also bringing about a danger that uniformity in line width of the area close to the middle deteriorates.

Additionally, since the developing solution is discharged while the semiconductor wafer is rotated, solution face waviness occurs at the time of heaping of the developing solution caused by inertial force of the developing solution. As a result, there occurs an area where the developing solutions are vigorously mixed or an area without such vigorous mixture, thereby bringing about a disadvantage that the uniformity of the developing becomes worse.

BRIEF SUMMARY OF THE INVENTION

Therefore, it is a conceivable case to employ coating means as shown in FIG. 10 using the same developing solution supply nozzle as the aforementioned. FIG. 10 shows a scan method in which the supply nozzle 12 is moved to the outside of the rim of the wafer W to be placed and further moved therefrom to the outside of the rim of the wafer on the other side while performing discharge.

The apparatus shown in FIGS. 9A and 9B has a cylindrical cup 13 around the wafer W and a series of developing processing is performed in the cup 13. The cylindrical cup 13 is a component for preventing a liquid from splashing out and collecting a splashed rinse liquid in a rinse process in the case where the rinse liquid is discharged while the wafer W is rotated after the completion of the developing processing.

However, in the case where the processing method as shown in FIG. 10 is performed in such a cylindrical cup 13 disposed near the substrate, when the supply nozzle 12 is allowed to scan from an initial discharge position to the rim of the wafer W on the other side, the supply nozzle 12 lies off the cylindrical cup 13 in an area close to a discharge start position and an area close to the completion position where the supply nozzle 12 is tangent to the rim of the wafer W, thus the developing solution leaks out of the cylindrical cup 13 as shown by the diagonally shaded areas a in FIG. 10, thereby making a developing unit dirty.

Further, if the cylindrical cup 13 is increased in size, more specifically, the cup is increased in size to cover areas a, there arises a disadvantage that the developing unit must be upsized.

An object of the present invention is to provide a solution processing apparatus and method capable of preventing upsizing of the apparatus and preventing a processing solution from leaking outside the apparatus when a supply of the processing solution is performed by scanning a wafer with a supply nozzle having a supply area with a length of almost the same as a diameter of the wafer or more.

To achieve the above object, a solution processing apparatus according to the present invention comprises: a substrate holding section configure to horizontally hold a substrate and rotatable; a cup configure to surround the side of the substrate held by the substrate holding section; a nozzle extending along one side of the inside of the cup configure to supply a processing solution to the substrate; a moving mechanism configure to move the nozzle along a side adjacent to the one side of the inside of the cup; a raising and lowering mechanism configure to raise and lower the substrate holding section and the cup relative to each other; and a control mechanism configure to control a position in height of the cup relative to the substrate through the raising and lowering mechanism, between a level where an upper side of the cup is positioned by the side of a moving area of a discharge hole of the supply nozzle, and a level where a lower side of the cup is positioned by the side of the substrate.

According to the apparatus as described above, the supply nozzle moves in the upper side of the cup, thereby preventing the processing solution from leaking outside the cup and reducing an occupied area by the cup.

The apparatus may be arranged in the following manners: The cup is formed such that the upper side thereof is formed in a rectangular shape and the lower side thereof is formed in a cylindrical shape. When seen the cup from above, the portion forming the cylindrical shape is positioned within the portion forming the rectangular shape. The supply nozzle includes a supply area of the processing solution with a length corresponding to a width of an effective area of the substrate to supply the processing solution to the entire effective area of the substrate while moving from a waiting position off the effective area of the substrate. The apparatus further comprises a rinse liquid supply mechanism configure to supply a rinse liquid to the rotating substrate after the processing solution is supplied. An air supply section configure to supply clean air to a front face of the substrate is provided above the substrate and an exhaust port configure to perform exhaust is provided below the substrate, the clean air from the air supply section descending toward the substrate and being exhausted from the exhaust port via the cup. The apparatus further comprises: a rotation mechanism configure to rotate the substrate holding section; an exhaust mechanism configure to exhaust air between the substrate holding section and the cup; and an exhaust control section configure to operate the exhaust mechanism based on operation information of at least one of the rotation mechanism and the raising and lowering mechanism.

A solution processing method according to the present invention comprises: horizontally holding a substrate by a rotatable substrate holding section and surrounding the side of the substrate by a rectangular portion that is an upper side of a cup; supplying a processing solution to the substrate while a nozzle extending along one side of the inside of the cup is moved along a side adjacent to the one side of the inside of the cup; and surrounding the side of the substrate by a cylindrical portion that is a lower side of the cup by raising the cup relative to the substrate holding section to stabilize flows of air streams from above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
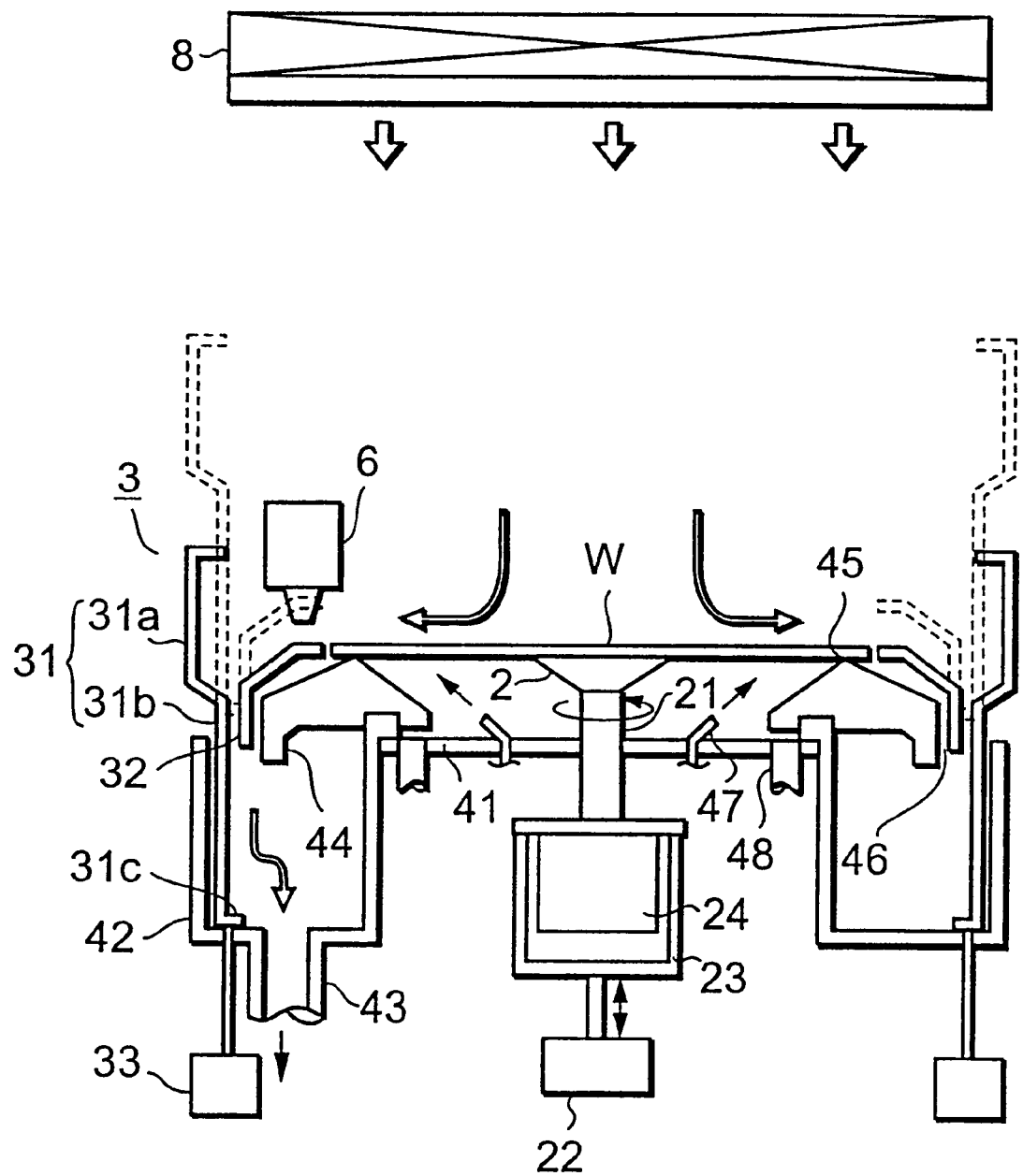
FIG. 1 is a sectional view showing a solution processing apparatus according to an embodiment of the present invention.

FIG. 1 is a diagrammatic view showing an embodiment in which a solution processing apparatus of the present invention is applied to a developing apparatus. Reference symbol 2 is a spin chuck that is a substrate holding section for vacuum-holding a central portion of a rear face of a substrate or wafer W to horizontally hold the wafer W. The spin chuck 2 is attached to a rotation shaft 21 of a spin motor 24 and is vertically movable from a developing processing position to a height for transfer to/from a wafer transfer apparatus (not shown) by means of a raising and lowering section 22 and a spin motor holding section 23.

A cup 3 is provided to surround the side of the wafer W suction-held by the spin chuck 2. The cup 3 comprises an outer cup 31 and an inner cup 32 which are individually vertically movable. The outer cup is configured to ascend and descend by a raising and lowering section 33 connected to a lower end portion of the outer cup 31, and the inner cup 32 is configured to ascend and descend together with the outer cup 31 within part of a moving range of the outer cup 31.

More specifically, the inner cup 32 is caught by a plurality of L-shaped portions 31c which are provided on a periphery of a lower end of the outer cup 31 at certain spaced intervals, whereby the outer cup 31 and the inner cup 32 are structured to ascend together. Moreover, splashes of a developing solution or a rinse liquid flow into a drain line 43 along an inner wall of the outer cup 31 between the L-shaped portions 31c.

Figure 2:
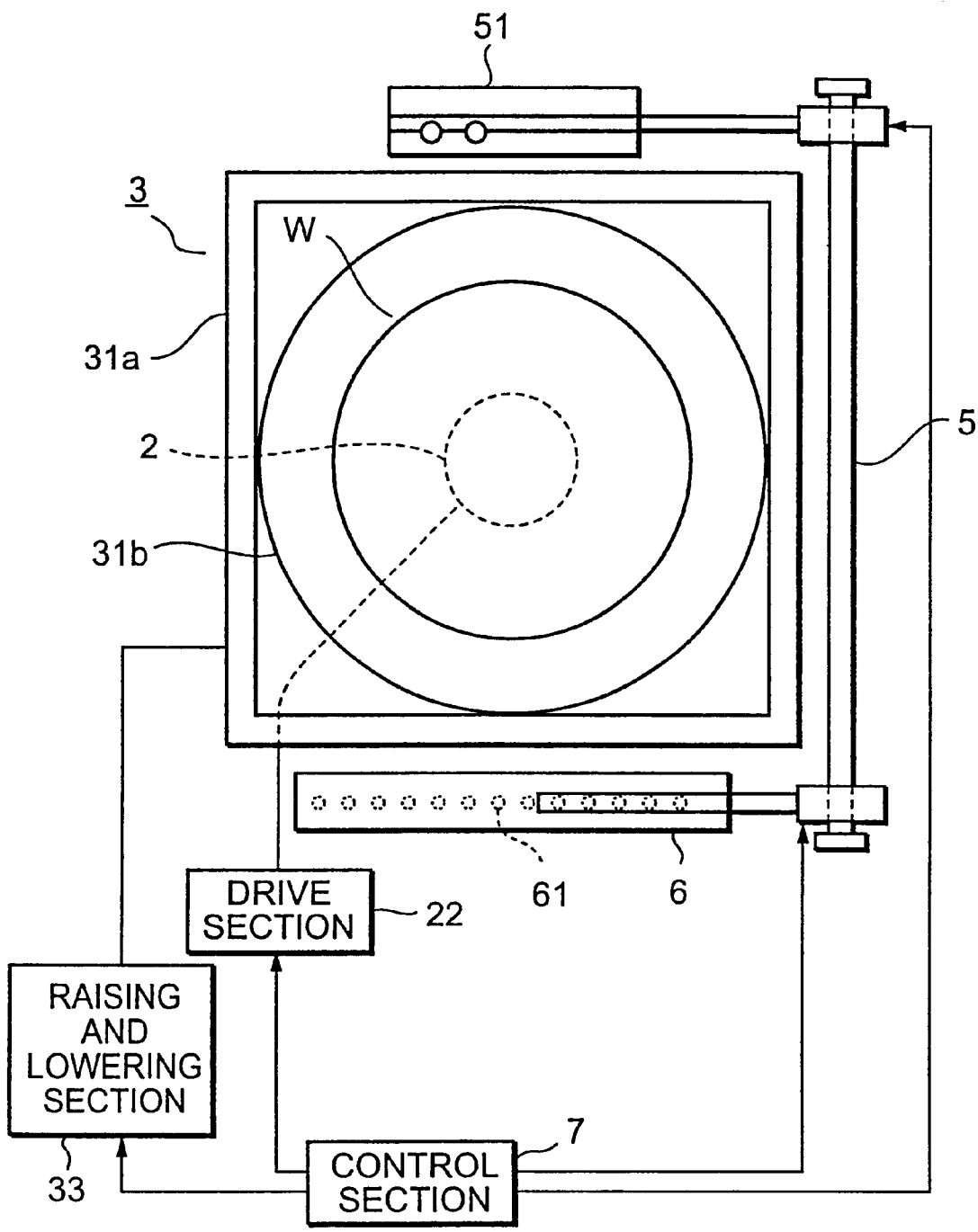
FIG. 2 is a plan view showing the solution processing apparatus according to the embodiment of the present invention.
Figure 3:
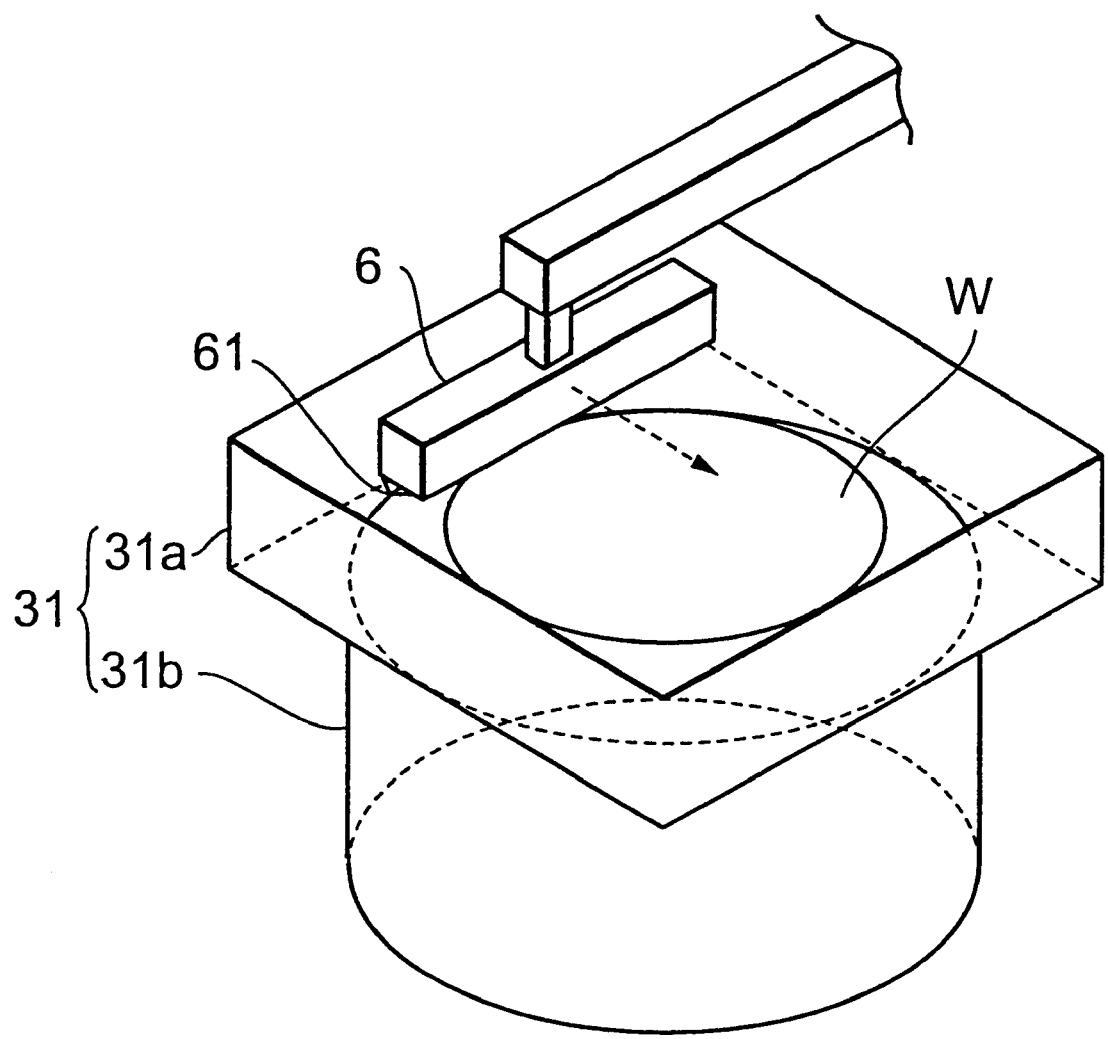
FIG. 3 is a perspective view showing operations of a supply nozzle in the solution processing apparatus.

The outer cup 31 is formed in a shape in which an upper cup portion 31a forming a rectangular shape and a lower cup portion 31b forming a cylindrical shape are integrated. Thus the shapes of horizontal cross sections of the upper side and the lower side of the outer cup 31 are a rectangular and a circle respectively. Accordingly, a supply nozzle 6 can be housed in the rectangular portion of the upper cup portion 31a to be parallel to a side of the upper cup portion 31a because of the above shape. As shown in FIG. 2 and FIG. 3, seen from above the wafer W, the lower cup portion 31b lies within the upper cup portion 31a. Meanwhile, an upper side of the cylinder of the inner cup 32 is formed to incline inward toward a top so that an upper side opening is smaller in area than a lower side opening. The upper side opening is positioned to surround the outer edge of the wafer W with a slight clearance therebetween when the inner cup 32 is at a lowered position.

Below the spin chuck 2 provided are a disc 41 which is nearly horizontally provided around the rotation shaft 21 and a liquid receiver 42 that is a recessed portion formed around the entire periphery of the disc 41. The drain line 43 is connected to a bottom plate of the liquid receiver 42.

A ring body 44 with a mountain-shaped cross section is provided in the vicinity of the rim portion of the disc 41 such that a summit portion 45 (an upper end) thereof is close to the rear face of the rim portion of the wafer W. A clearance 46 is provided between the outer periphery of the ring body 44 and the cup 3 (the inner cup 32), such that, for example, a developing solution or a rinse liquid described later flows along an inclined face, which inclines from the summit portion 45 outward and downward, through the clearance 46 to the liquid receiver 42.

Further, a plurality of rinse nozzles 47 are provided piercing the disc 41 from thereunder. The rinse nozzle 47 supplies a rinse liquid, for example, pure water to rinse the rear face side of the rim of the wafer W, and thus a rinse liquid supply port of the rinse nozzle 47 is bent so as to face the rim side of the wafer W.

Furthermore, connected to the disc 41 is a drain line 48 for naturally draining the rinse liquid which is supplied from the rinse nozzles 47, hits the wafer W or the ring body 44, and bounces back to the disc 41 side.

Next, the outside of the cup 3 will be explained. As shown in FIG. 2, for example, a guide rail 5 horizontally extending to be parallel to a side of the upper cup portion 31a is provided outside the outer cup 31. In the state shown in FIG. 2, the supply nozzle 6 and a rinse nozzle 51 are positioned at one end and the other end of the guide rail 5, respectively. The nozzles 6 and 51 are configured to be guided by the guide rail 5 by means of a drive mechanism (not shown) so as to be movable above the wafer W. In this embodiment, a moving mechanism for moving the supply nozzle 6 is formed with the drive mechanism (not shown) and the guide rail 5.

The supply nozzle 6 includes a raising and lowering mechanism and is provided with many discharge holes 61 arranged over almost the same length as a diameter of the wafer W. The supply nozzle 6 is suitable if a length of the supply area thereof is almost the same as a width of an effective area of a substrate (a length of almost the diameter of the wafer W in this embodiment), and it is suitable even if it is longer than that. In other words, it is suitable that the length of the supply area is a length with which the effective area can be supplied with a processing solution. Moreover, the rinse nozzle 51 also includes a raising and lowering mechanism in the same manner as the supply nozzle 6. The movement and ascent and descent of the supply nozzle 6 and the rinse nozzle 51 are controlled by a control section 7. The control section 7 is also connected to the drive section 22 of the spin chuck 2 and the raising and lowering section 33 of the outer cup 31 so as to perform control of rotation and ascent and descent of the spin chuck 2 by the drive section 22, and control of ascent and descent of the cup 3 by the raising and lowering section 33, and to allow the supply nozzle 6 and the rinse nozzle 51 to operate in accordance with states of the spin chuck 2 and the cup 3.

An air supply section 8 is provided above a developing unit comprising the spin chuck 2 and the cup 3, for supplying clean air, which is adjusted to a predetermined temperature and humidity, to the front face of the wafer W as downflow to thereby prevent particles from adhering to the wafer W. The aforesaid drain line 43 serves as a drain pipe and a gas-exhaust pipe. The air supplied from the air supply section 8 flows outward along the front face of the wafer W and passes through the clearance 46 between the cup 3 and the ring body 44 to be exhausted from the drain line 43. It should be noted that the drain line 43 is provided with exhaust means composed of, for example, a valve and an exhaust pump (not shown). The exhaust means operates based on operation information of at least one of the drive section 22 of the spin chuck 2 and the raising and lowering section 33 by the medium of the control section 7. For example, when the spin chuck 2 is stopped or the cup 31 is raised, or with the AND condition of them, the valve is opened to perform exhaust operation.

Figure 4A:
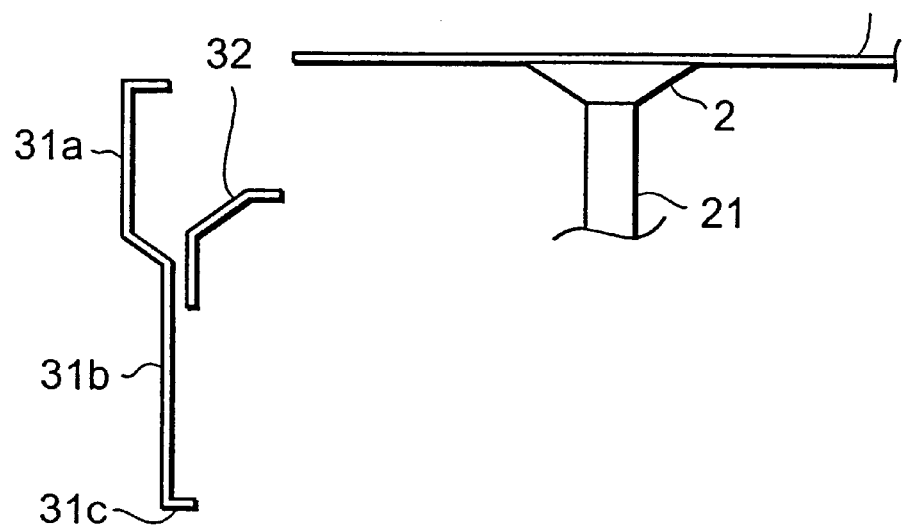
FIGS. 4A and 4B are process views showing operations of the solution processing apparatus.

Next, operations in this embodiment will be explained with reference to FIGS. 4A and 4B, and FIGS. 5A and 5B. First, the spin chuck 2 is raised to a position above the cup 3 and the wafer W which has been already coated with a resist and subjected to exposure processing in the previous processes is transferred from a transfer arm (not shown) to the spin chuck 2 (FIG. 4A). Incidentally, the outer cup 31 and the inner cup 32 are both in a state of being lowered at this time.

Figure 4B:
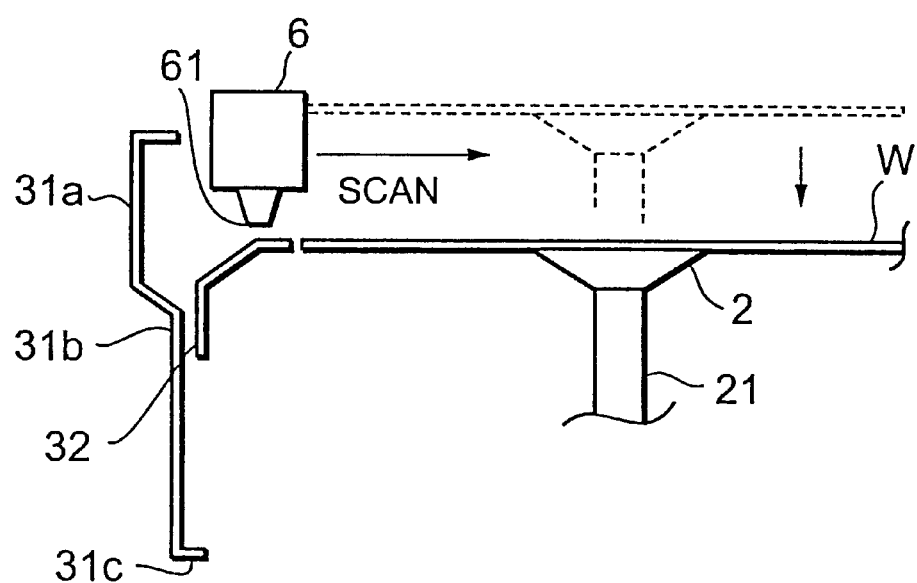

Subsequently, as shown in FIG. 4B, the spin chuck 2 is lowered to a position where the height of the top face of the wafer W is almost the same as that of the upper end of the inner cup 32. After the descent of the spin chuck 2, the supply nozzle 6 is guided from an outside reference position of the outer cup 31 to a position corresponding to a portion between the upper cup portion 31a and the rim of the wafer W along the guide rail 5 and subsequently descents therefrom to a waiting position outside the rim of the wafer W (FIG. 4B). At this time, the position (height) of the supply nozzle 6 is set at the height where supply of a developing solution is performed for the wafer W, and thus the discharge holes 61 are placed at a position higher than the wafer W surface level by, for example, about 1 mm.

Figure 5A:
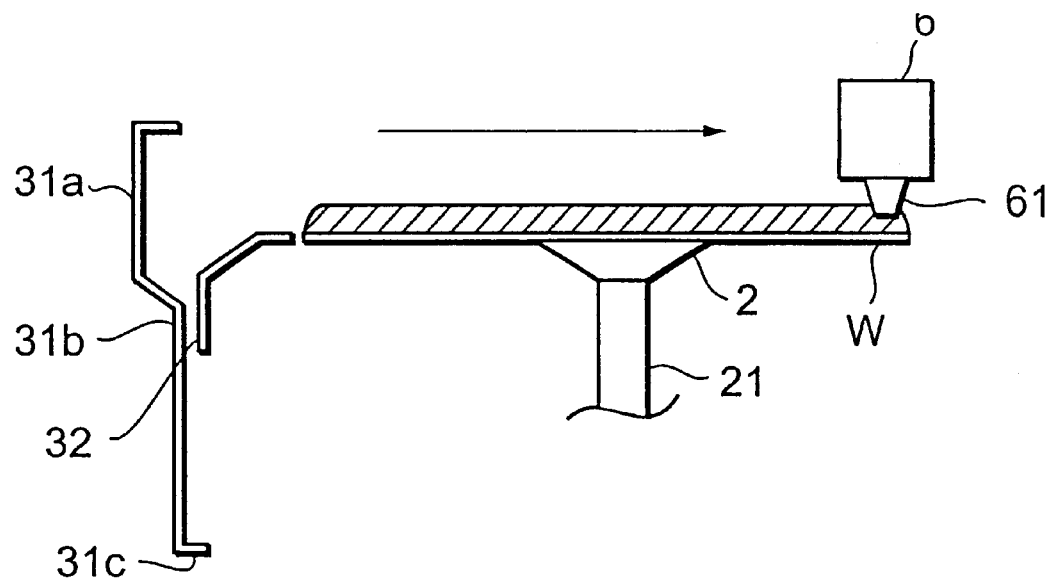
FIGS. 5A and 5B are process views showing operations of the solution processing apparatus.

Thereafter, the supply nozzle 6 starts a scan from the position in FIG. 4B while discharging the developing solution and moves from one end side to the other end side of the wafer W as shown in FIG. 5A (moves from left to right in FIG. 5A), whereby a solution film with a thickness of, for example, 1.2 mm is formed on the front face of the wafer W, and stationary developing is performed. Further, during the stationary developing, the gas-exhaust from the drain line 43 is stopped by way of example. At this time, the movement of the supply nozzle 6 is performed at a scan speed of, for example, 10 cm/sec in such a manner that the center of the discharge area where the discharge holes 61 of the supply nozzle 6 are arranged passes through a position above the center of the wafer W. After the scan of the wafer W, the supply nozzle 6 is raised to a position above 31a at a position outside the right end side of the wafer W in FIG. 5A, and returned to the reference position shown in FIG. 2. In the scan by the supply nozzle 6, the developing solution, which is discharged to the outside of both ends of the wafer W and falls down therefrom, flows to the liquid receiver 42 along the inner cup 32 and the ring body 44 to be drained from the drain line 43.

Figure 5B:
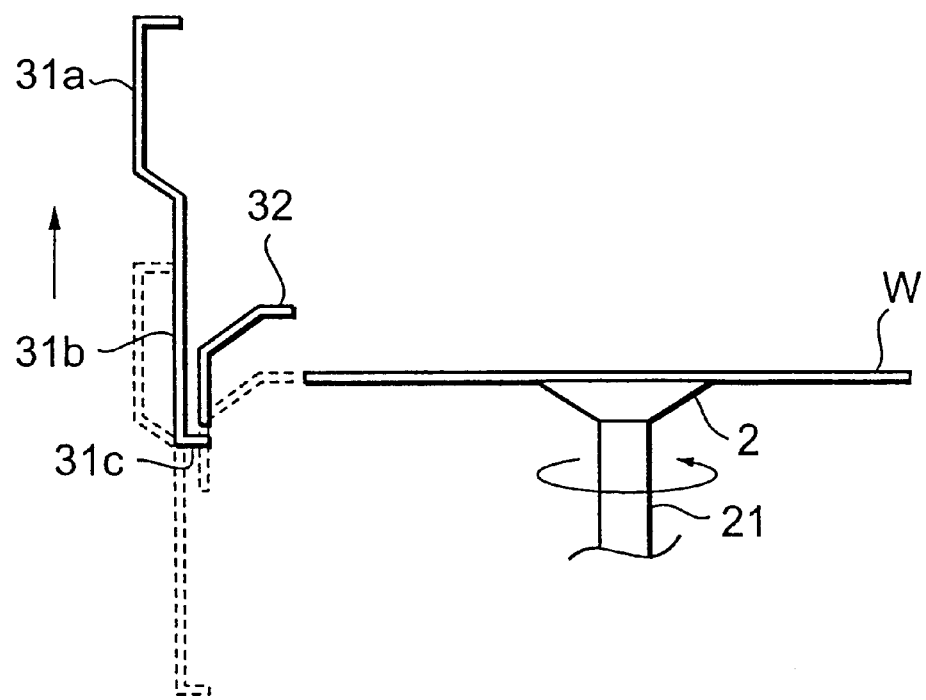

Next, the gas-exhaust from the drain line 43 is restarted and the rinse nozzle 51 replaces the supply nozzle 6 and moves while guided by the guide rail 5 so that a discharge portion thereof is positioned above the middle of the wafer W. Then, the outer cup 31 is raised, thereby bringing about a state in which the lower cup portion 31b is placed over the upper side level and the lower side level of the wafer W, and at this time the inner cup 32 is also raised by the L-shaped portions 31c of the outer cup 31 (FIG. 5B). Subsequently, the spin chuck 2 is rotated and a rinse liquid, for example, pure water is supplied from the rinse nozzle 51 to the middle portion of the wafer W and spreads out from the middle portion of the wafer W toward the rim portion by centrifugal force to thereby rinse away the developing solution on the wafer W.

Meanwhile, a rinse liquid, for example, pure water is discharged also from the rinse nozzles 47 below the wafer W toward the rim of the rear face of the wafer W to thereby rinse away the developing solution which has come onto the rim of the rear face and then drained from the drain lines 41 and 43.

Thereafter, the discharge of the rinse liquid from the rinse nozzles 51 and 47 is stopped and the wafer W is kept on rotating to be dried by spinning. At this time, the outer cup 31 is still at the raised position as during the developing. After the completion of the spin-drying, the outer cup 31 is lowered and the spin chuck is raised for replacement of the wafer W, thereby returning to the state shown in FIG. 4A.

As described above, through the use of the solution processing apparatus according to this embodiment of the present invention, since the upper portion of the outer cup 31 (the upper cup portion 31a) is formed in a rectangular shape and the supply nozzle 6 is positioned inside the outer cup 31 to perform a scan, the processing solution is prevented from leaking outside the outer cup 31 and an occupied area by the upper cup portion 31a can be small.

Further, the inner cup 32 is formed in a cylindrical shape and is raised so that the inner cup 32 is positioned by the side of the wafer W during the rinse for the wafer W, whereby the inner cup 32 can catch splashes of the rinse liquid, which has been shaken off the rotated wafer W, with little bounce. In other words, splashes of the rinse liquid splash to the outside of the wafer W along an arc, and a face which catches the splashes is a circumferential face, so that they smoothly impact the inner cup 32 with small impact, resulting in small bounce of splashes.

Further, in this embodiment, the outer cup 31 is placed at the raised position from when the developing solution is supplied to the wafer W to the completion of the dry of the wafer W, thereby bringing about an effect of enhancing uniformity of the developing. More specifically, the wafer W is placed in an atmosphere of so-called downflow (descending air streams of clean air). The developing solution after being heaped on the wafer W is rested for a predetermined period of time to thereby perform the developing, and it is preferable that uniform air streams blow against the entire face of the wafer W during the developing to obtain uniform temperature distribution to thereby perform uniform developing. In the above state, if the periphery of the wafer W is surrounded by the upper cup portion 31a in a rectangular shape, the size of a space between the rim of the wafer W and the inner face of the lower cup portion 31b (a space for exhaust) is different depending on the position in the peripheral direction. Therefore, turbulent flows occur caused by bounce of downflow, thereby increasing the degree of ununiformity in air streams on the front face of the wafer W, resulting in deteriorated developing uniformity (uniformity in line width of a pattern). Compared to the above, if the inner cup 32 and the lower cup portion 31b both in a cylindrical shape are positioned around the wafer W, the sizes of the exhaust spaces become uniform, whereby the air streams on the front face of the wafer W become uniform, thereby making it possible to suppress developing unevenness.

For the above reason, the cup 3 surrounding the side of the wafer W is formed of a structure having different shapes between the upper side and the lower side, and is controlled so that the cup portion with a suitable shape is positioned by the side of the wafer W in accordance with either the time of supply of the processing solution to the wafer W or the time of rinse and drying, thereby making it possible to realize operations with the respective advantages of the rectangular cup and the cylindrical cup without occupying a space larger than that of a conventional apparatus.

Incidentally, the solution processing apparatus according to this embodiment is not limited to the developing processing and may be applied to coating processing of a resist.

Figure 6:
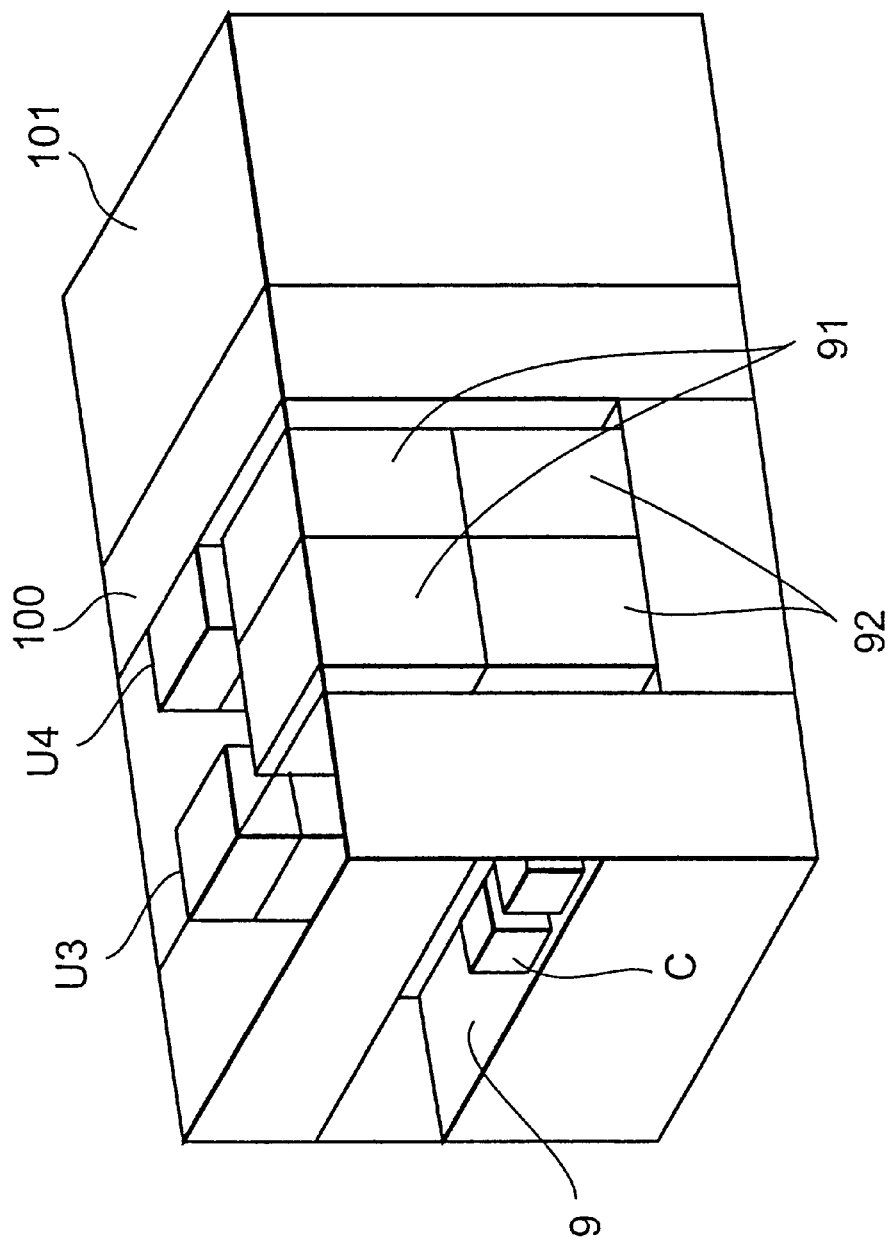
FIG. 6 is a perspective view showing an example of a coating and developing apparatus in which the solution processing apparatus is installed.
Figure 7:
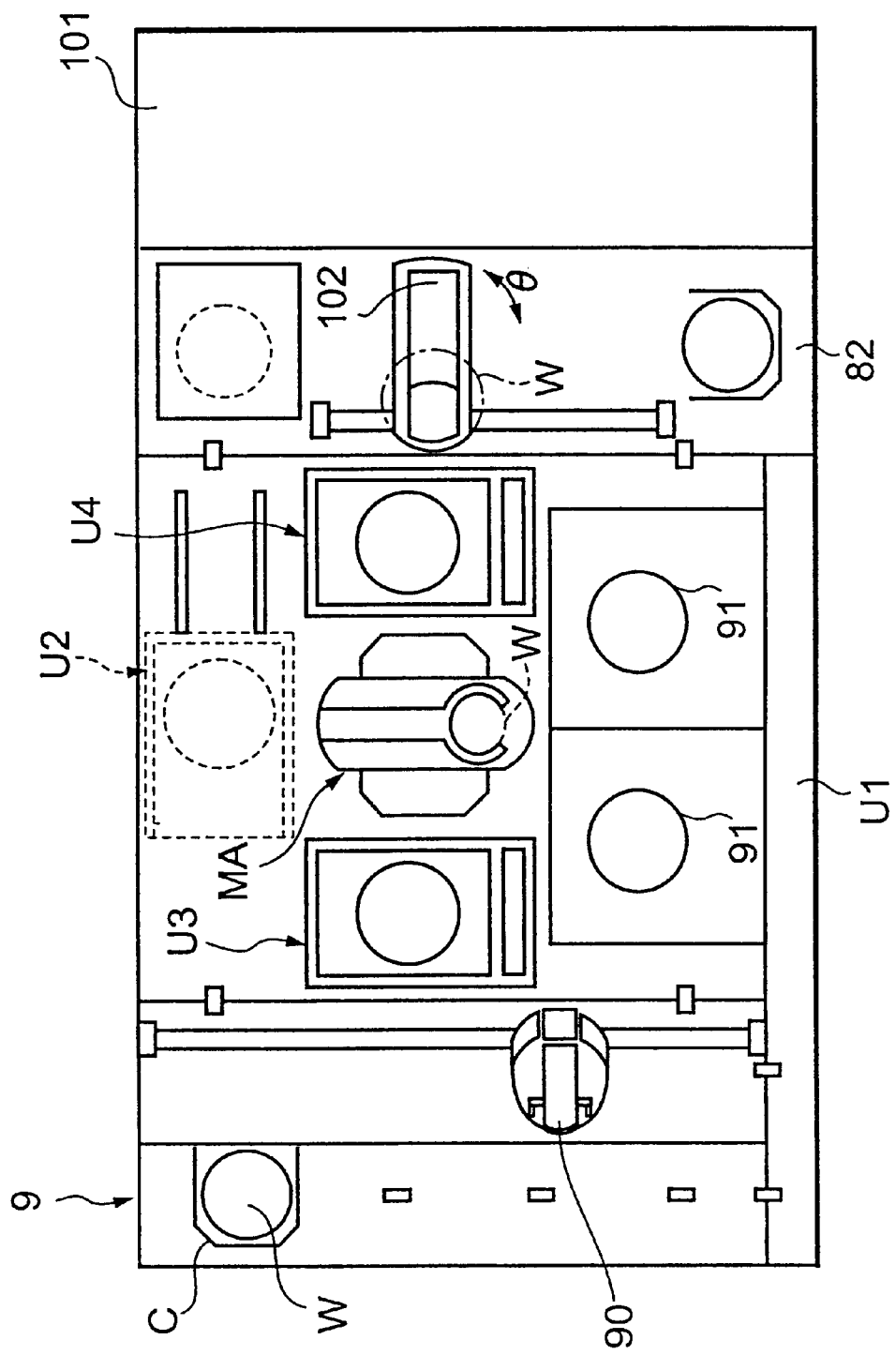
FIG. 7 is a plan view showing the example of the coating and developing apparatus in which the solution processing apparatus is installed.

Next, an outline of an example of a coating and developing apparatus in which the aforesaid developing apparatus is installed in a unit will be explained with reference to FIG. 6 and FIG. 7. In FIG. 6 and FIG. 7, reference symbol 9 is a carrying in/out stage for carrying-in/out a wafer cassette and a cassette C in which, for example, 25 wafers W are housed is mounted thereon by, for example, an automatic transfer robot. A delivery arm 90 for the wafer W is provided to be movable in an X-direction and a Y-direction and rotatable in a θ-direction (rotation around a vertical axis) in an area facing the carrying in/out stage 9. Moreover, on the back side of the delivery arm 90, a coating and developing system unit u1 is arranged, for example, on the right side, for example, seen from the carrying in/out stage 9 to the back side, and heating and cooling system units u2, u3, and u4 are arranged on the left side, the front side, and the back side respectively. Further, a wafer transfer arm MA, which is, for example, ascendable and descendable, movable laterally and longitudinally, and rotatable around a vertical axis, for delivering the wafer W between the coating and developing system unit and the heating and cooling system units is provided. However, the unit u2 and the wafer transfer arm MA are not shown in FIG. 6 for convenience.

In the coating and developing system unit, for example, two developing units 91 each including the aforesaid developing apparatus are provided at the upper tier, and two coating units 92 are provided at the lower tier. In the heating and cooling system unit, a heating unit, a cooling unit, a hydrophobic processing unit, and the like are vertically arranged.

If the aforesaid section including the above-described coating and developing system unit and the heating and cooling system units is called a clean track, an aligner (light-exposing apparatus) 101 is connected to the back side of the clean track with an interface unit 100 therebetween. The interface unit 100 performs transfer of the wafer W between the clean track and the aligner 101 by a wafer transfer arm 102 which is configured to be, for example, ascendable and descendable, movable laterally and longitudinally, and rotatable around a vertical axis.

Explaining the flow of the wafer in this apparatus, first a wafer cassette C in which wafers W are housed is carried into the carrying in/out stage 9 from the outside, and the wafer W is taken out of the cassette C by the wafer transfer arm 90 and transferred to the wafer transfer arm MA via a transfer table that is one of shelves in the aforesaid heating and cooling unit u3. Then, the wafer W is subjected to hydrophobic processing in a processing section at one shelf in the unit u3 and thereafter coated with a resist solution in the coating unit 92, whereby a resist film is formed. The wafer W coated with the resist film is heated in the heating unit, then transferred to the aligner 101 via the interface unit 100, and exposure is performed through a mask corresponding to a pattern in the aligner 101.

Thereafter, the wafer W is heated in the heating unit and then cooled in the cooling unit. Subsequently, the wafer W is transferred to the developing unit 91 to be subjected to developing processing, whereby a resist mask is formed. Thereafter, the wafer W is returned into the cassette C on the carrying in/out stage 9.

Next, another embodiment of the present invention will be explained.

Figure 8:
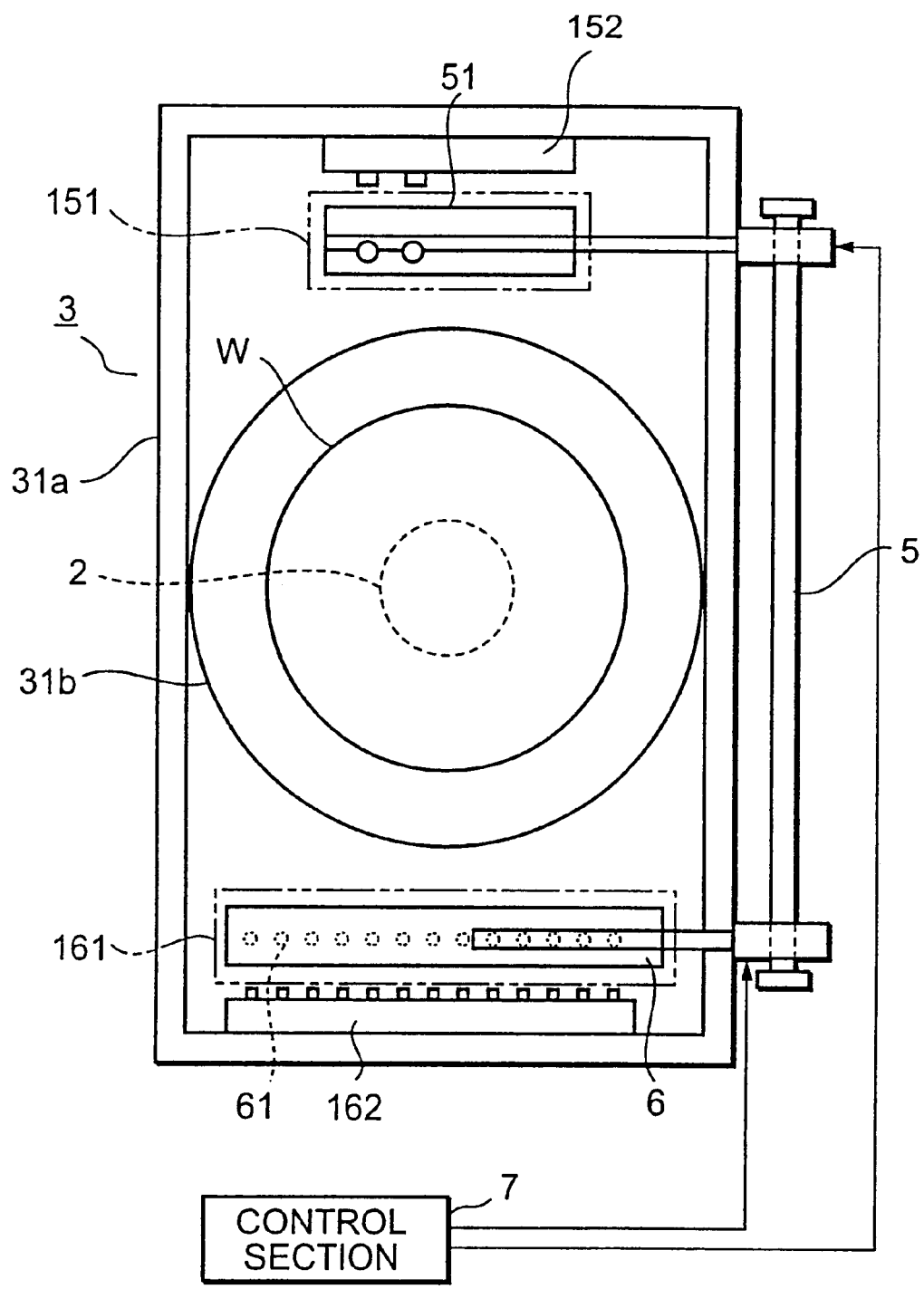
FIG. 8 is a plan view showing a solution processing apparatus according to another embodiment of the present invention.
Figure 9A:
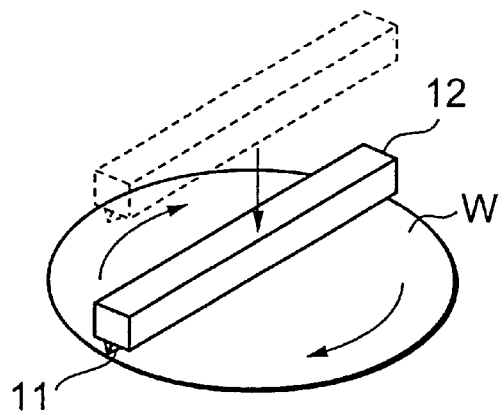
FIGS. 9A and 9B are explanatory views showing an example of a conventional solution processing apparatus.
Figure 9B:
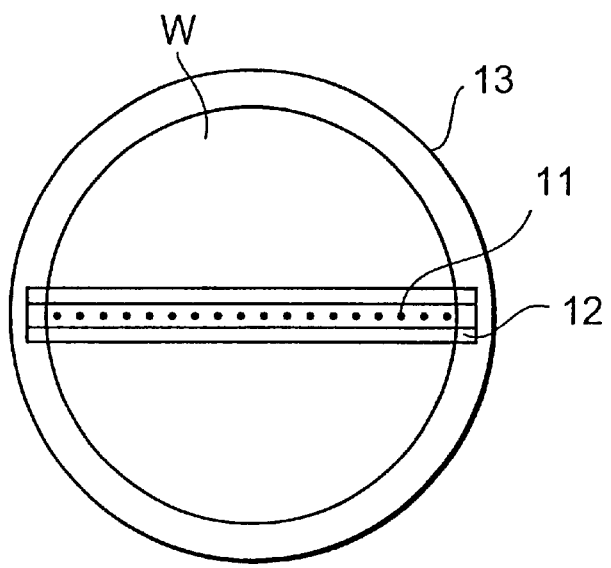
Figure 10:
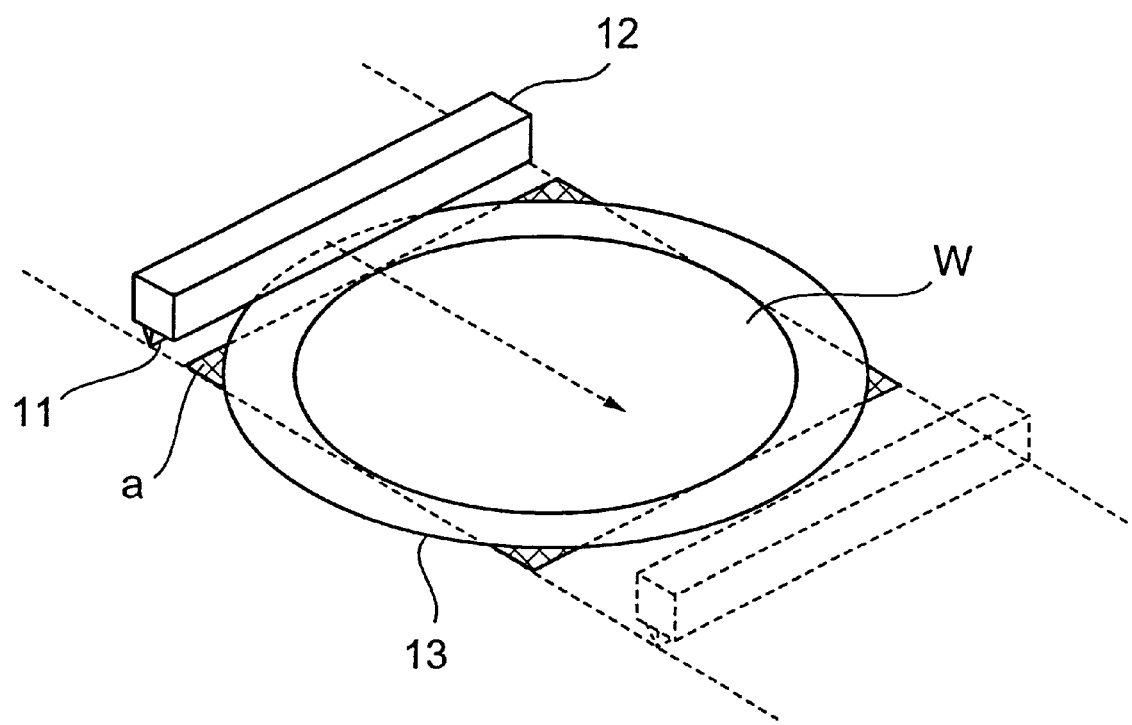
FIG. 10 is a view showing an imaginary example of a solution processing apparatus.

In this embodiment, as shown in FIG. 8, home positions 161 and 151 of a supply nozzle 6 and a rinse nozzle 51 are provided in an outer cup 31. At the home positions 161 and 151, rinse liquid discharge nozzles 162 and 152 for discharging a rinse liquid toward the supply nozzle 6 and the rinse nozzle 51 are provided respectively. Further, dummy dispensing is performed by the supply nozzle 6 near the home position 161 of the supply nozzle 6. In comparison with that the nozzle cleaning and the dummy dispensing have been conventionally performed in a bath outside the cup, the nozzle cleaning and the dummy dispensing are performed in the cup as described above, thereby realizing reduction in parts count and reduction in size of the apparatus.

It should be noted that though the upper cup portion 31a of the outer cup 31 is formed in a rectangular shape in the aforesaid embodiments, but not limited to such a shape, it may be naturally formed in a cylindrical shape or the like.

As has been described, the present invention can use various solution film coating methods without upsizing the processing apparatus and, for example, can choose an optimal method for obtaining high line width uniformity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solution processing apparatus, comprising:
   a substrate holding section configured to horizontally hold a substrate and being rotatable;
   a cup configured to surround the side of the substrate held by the substrate holding section, the cup comprising an upper portion having a rectangular shape and a lower portion having a cylindrical shape, the upper and lower portions being integrally molded with each other;
   a nozzle extending along one side of the inside of the cup and configured to supply a processing solution to the substrate;
   a moving mechanism configured to move the nozzle along a side adjacent to the one side of the inside of the cup;
   a raising and lowering mechanism configured to raise and lower the substrate holding section and the cup relative to each other; and
   a control mechanism configured to control a position in height of the cup relative to the substrate through the raising and lowering mechanism, between a first level where the upper portion having a rectangular shape is positioned by the side of a moving area of a discharge hole of the supply nozzle, and a second level where the lower portion having a cylindrical shape is positioned by the side of the substrate.

2. The apparatus according to claim 1, wherein the supply nozzle includes a supply area of the processing solution with a length corresponding to a width of an effective area of the substrate to supply the processing solution entirely over the effective area of the substrate while moving from a waiting position off the effective area of the substrate.

3. The apparatus according to claim 1, further comprising a rinse liquid supply mechanism configured to supply a rinse liquid to the substrate being rotated after the processing liquid is supplied.

4. The apparatus according to claim 1, wherein an air supply section configure to supply clean air to a front face of the substrate is provided above the substrate and an exhaust port configured to perform exhaust is provided below the substrate, the clean air from the air supply section descending toward the substrate and being exhausted from the exhaust port via the cup.

5. The apparatus according to claim 1, further comprising:
   a rotation mechanism configured to rotate the substrate holding section;
   an exhaust mechanism configured to exhaust air between the substrate holding section and the cup; and
   an exhaust control section configured to operate the exhaust mechanism based on operation information of at least one of the rotation mechanism and the raising and lowering mechanism.

6. The apparatus according to claim 1, wherein a home position of the supply nozzle is provided in the cup.

7. The apparatus according to claim 6, further comprising a rinse mechanism configured to discharge a rinse liquid toward the supply nozzle positioned at the home position.

8. The apparatus according to claim 1, wherein the supply nozzle is configured to perform dummy dispensing in the cup.

9. The apparatus according to claim 1, wherein when the cup is seen from above, the lower portion having a cylindrical shape is positioned within the upper portion having a rectangular shape.

10. The apparatus according to claim 1, further comprising an inner cup having a cylindrical shape and disposed inside the cup, the inner cup having an upper portion inclined inward toward a top, wherein, when the cup is positioned at the first level, the inner cup is positioned such that a top end of the upper portion of the inner cup is at a height substantially the same as that of a top surface of the substrate on the substrate holding section.

11. The apparatus according to claim 10, wherein, when the cup is position at the second level, the inner cup is positioned such that the top end of the upper portion of the inner cup is at a height above the substrate on the substrate holding section.

12. The apparatus according to claim 11, wherein the cup and the inner cup respectively include engaging portions to engage with each other, so as for the inner cup to move up and down partly along with the cup moving up and down, such that the engaging portions start engagement while the cup moves up, and release the engagement while the cup moves down.

* * * * *